US008384087B2

(12) United States Patent
Son et al.

(10) Patent No.: US 8,384,087 B2
(45) Date of Patent: Feb. 26, 2013

(54) THIN FILM TRANSISTOR, ORGANIC LIGHT EMITTING DIODE DISPLAY DEVICE HAVING THE SAME, AND METHOD OF FABRICATING THE SAME

(75) Inventors: Yong-Duck Son, Yongin (KR); Ki-Yong Lee, Yongin (KR); Joon-Hoo Choi, Yongin (KR); Min-Jae Jeong, Yongin (KR); Seung-Kyu Park, Yongin (KR); Kil-Won Lee, Yongin (KR); Jae-Wan Jung, Yongin (KR); Dong-Hyun Lee, Yongin (KR); Byung-Soo So, Yongin (KR); Hyun-Woo Koo, Yongin (KR); Ivan Maidanchuk, Yongin (KR); Jong-Won Hong, Yongin (KR); Heung-Yeol Na, Yongin (KR); Seok-Rak Chang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1 day.

(21) Appl. No.: 12/805,995

(22) Filed: Aug. 27, 2010

(65) Prior Publication Data
US 2011/0114963 A1    May 19, 2011

(30) Foreign Application Priority Data
Nov. 13, 2009 (KR) .................. 10-2009-0109837

(51) Int. Cl.
*H01L 27/14* (2006.01)

(52) U.S. Cl. ............. 257/72; 257/E27.273; 438/149

(58) Field of Classification Search ............ 257/72, 257/40, 66, E21.413, E29.273, E51.022; 438/166
See application file for complete search history.

(56) References Cited

U.S. PATENT DOCUMENTS

| 7,247,880 | B2 | 7/2007 | Park et al. | |
|---|---|---|---|---|
| 2002/0001868 | A1* | 1/2002 | Joo et al. | 438/30 |
| 2005/0285110 | A1* | 12/2005 | Seo et al. | 257/66 |
| 2006/0006465 | A1* | 1/2006 | Park et al. | 257/347 |
| 2007/0243670 | A1* | 10/2007 | Chen et al. | 438/149 |
| 2008/0067520 | A1 | 3/2008 | Jung et al. | |
| 2008/0157099 | A1* | 7/2008 | Yang et al. | 257/83 |
| 2008/0203501 | A1* | 8/2008 | Yamazaki et al. | 257/413 |

FOREIGN PATENT DOCUMENTS

| JP | 2001-308334 | 11/2001 |
|---|---|---|
| JP | 2005-159307 | 6/2005 |
| JP | 2006-024881 | 1/2006 |
| KR | 10 2004-0053868 A | 6/2004 |
| KR | 10-2004-0082168 A | 9/2004 |
| KR | 10-2006-0003706 A | 1/2006 |
| KR | 10-2008-0025830 A | 3/2008 |
| KR | 10 2008-0085503 A | 9/2008 |

* cited by examiner

*Primary Examiner* — Ha Tran T Nguyen
*Assistant Examiner* — Vongsavanh Sengdara
(74) *Attorney, Agent, or Firm* — Lee & Morse, P.C.

(57) ABSTRACT

A thin film transistor includes a substrate, a buffer layer on the substrate, a semiconductor layer including source/drain regions and a channel region on the buffer layer, a gate insulating layer corresponding to the channel region, a gate electrode corresponding to the channel region, and source/drain electrodes electrically connected to the semiconductor layer. A polysilicon layer of the channel region may include only a low angle grain boundary, and a high angle grain boundary may be disposed in a region of the semiconductor layer that is apart from the channel region.

17 Claims, 5 Drawing Sheets

THIN FILM TRANSISTOR, ORGANIC LIGHT EMITTING DIODE DISPLAY DEVICE HAVING THE SAME, AND METHOD OF FABRICATING THE SAME

BACKGROUND

1. Field

Embodiments relate to a thin film transistor, an organic light emitting diode display device having the same, and a method of fabricating the same.

2. Description of the Related Art

Polysilicon layers may provide high electric field effect mobility, may be adapted to high speed operational circuits, and may be used to realize complementary metal-oxide semiconductor (CMOS) circuits. For example, polysilicon layers may be used to form semiconductor layers for thin film transistors (TFTs). Transistors using such polysilicon layers may be used for active devices of active matrix liquid crystal displays (AMLCDs), and for switching devices and driving devices of organic light emitting diode display devices (OLED display devices).

SUMMARY

Embodiments are directed to a thin film transistor, an organic light emitting diode display device having the same, and a method of fabricating the same, which substantially overcome one or more problems due to the limitations and disadvantages of the related art.

It is therefore a feature of an embodiment to provide a thin film transistor, an organic light emitting diode display device having the same, and a method of fabricating the same that are capable of controlling a metal silicide formed by a metal catalyst using a protection layer pattern in a method of crystallizing an amorphous silicon layer, improving characteristics of a semiconductor layer.

At least one of the above and other features and advantages may be realized by providing a thin film transistor, including a substrate; a buffer layer on the substrate; a semiconductor layer including source/drain regions and a channel region on the buffer layer, the channel region including a polysilicon layer; a gate insulating layer corresponding to the channel region; a gate electrode corresponding to the channel region; and source/drain electrodes electrically connected to the semiconductor layer. The polysilicon layer of the channel region may include only a low angle grain boundary, and a high angle grain boundary may be disposed in a region of the semiconductor layer apart from the channel region.

A metal silicide may be disposed in a region of the semiconductor layer except the channel region, the metal silicide being spaced apart from the high angle grain boundary.

The channel region may be between the metal silicide and the high angle grain boundary.

The low angle grain boundary may extend in a same direction as current flow through the channel region, and the high angle grain boundary may extend in a direction perpendicular to current flow through the channel region.

The low angle grain boundary is a boundary between crystal grains that extend from crystal seeds of a metal silicide. The metal silicide may be disposed at intervals of about 1 µm to about 100 µm.

At least one of the above and other features and advantages may also be realized by providing a method of fabricating a thin film transistor, the method including forming a buffer layer on a substrate; forming a semiconductor layer including source/drain regions and a channel region on the buffer layer, the channel region including a polysilicon layer; forming a gate insulating layer corresponding to the channel region; forming a gate electrode corresponding to the channel region; and forming source/drain electrodes electrically connected to the semiconductor layer. The polysilicon layer of the channel region may be formed to include only a low angle grain boundary, and a high angle grain boundary may be formed in a region of the semiconductor layer apart from the channel region.

Forming the semiconductor layer may include forming an amorphous silicon layer on the buffer layer; forming a protection layer pattern on a portion of the amorphous silicon layer; forming a metal catalyst layer on the substrate; annealing the substrate, on which the metal catalyst layer is formed, to form a linear pattern of a metal silicide at edges of the protection layer pattern and then crystallizing the amorphous silicon layer to form a preliminary polysilicon layer using the metal silicide as a seed, where the metal silicide is formed from metal in the metal catalyst layer; removing at least part of the protection layer pattern; and patterning the preliminary polysilicon layer to form the semiconductor layer.

The protection layer pattern may be formed to have a rectangular shape and a thickness of about 2000 Å or more.

The channel region of the semiconductor layer may be between the linear pattern of the metal silicide and the high angle grain boundary.

Forming the metal catalyst layer may include disposing about $10^{12}$ to about $10^{14}$ atom/cm$^2$ of a catalyst metal on the substrate.

The catalyst metal may be nickel and the metal silicide may be nickel silicide.

The protection layer pattern may have a dimension in a direction orthogonal to the channel region that is about three times the length of the channel region, and the protection layer pattern may have a dimension in a direction parallel to the channel region that is about two times the width of the channel region.

At least one of the above and other features and advantages may also be realized by providing an organic light emitting diode display device, including a substrate; a buffer layer disposed on the substrate; a semiconductor layer including source/drain regions and a channel region on the buffer layer, the channel region including a polysilicon layer; a gate insulating layer corresponding to the channel region; a gate electrode corresponding to the channel region; and an interlayer insulating layer on the substrate; source/drain electrodes electrically connected to source/drain regions of the semiconductor layer; a protection layer on the substrate; and an organic light emitting diode including a first electrode electrically connected to one of the source/drain electrodes, an organic layer, and a second electrode. The polysilicon layer of the channel region may include only a low angle grain boundary, and a high angle grain boundary may be disposed in a region of the semiconductor layer apart from the channel region.

A metal silicide may be disposed in a region of the semiconductor layer except the channel region, the metal silicide being spaced apart from the high angle grain boundary.

The channel region may be between the metal silicide and the high angle grain boundary.

The low angle grain boundary may extend in a same direction as current flow through the channel region, and the high angle grain boundary may extend in a direction perpendicular to current flow through the channel region.

The low angle grain boundary is a boundary between crystal grains that extend from crystal seeds of a metal silicide. The metal silicide may be disposed at intervals of about 1 µm to about 100 µm.

Also provided is a thin film transistor that includes a substrate, a buffer layer disposed on the substrate, a semiconductor layer including source/drain regions and one or more channel regions disposed on the buffer layer, a gate insulating layer disposed on the entire surface of the substrate, a gate electrode disposed on the gate insulating layer, an interlayer insulating layer disposed on the entire surface of the substrate, and source/drain electrodes disposed on the interlayer insulating layer and electrically connected to the semiconductor layer. A polysilicon layer of a channel region of the semiconductor layer includes only a low angle grain boundary, and a high angle grain boundary is disposed in a region of the semiconductor layer except the channel region. A grain boundary may be disposed in a region of the semiconductor layer except the channel region. A metal silicide may be disposed in the region except the channel region. The metal silicide may be disposed in a linear shape. The channel region may be formed between the metal silicide and the grain boundary of the semiconductor layer. The metal silicide may be disposed at intervals of about 1 to 100 μm.

The method of fabricating a thin film transistor may include forming a substrate, forming a buffer layer on the substrate, forming an amorphous silicon layer on the buffer layer, forming a protection layer pattern on a portion of the amorphous silicon layer, forming a metal catalyst layer on the entire surface of the substrate, annealing the substrate, on which the metal catalyst layer is formed, to form a metal silicide on an edge of the protection layer pattern in a linear shape and then crystallizing the amorphous silicon layer using the metal silicide as a seed, removing the protection layer pattern, patterning the polysilicon layer to form a semiconductor layer, forming a gate insulating layer on the semiconductor layer, forming a gate electrode on the gate insulating layer, forming an interlayer insulating layer on the gate electrode, and forming source/drain electrodes electrically connected to the semiconductor layer on the interlayer insulating layer. A high angle grain boundary may extend between two adjacent channel regions in a direction that is parallel to current flow, and the semiconductor layer may be patterned to separate the two adjacent channel regions and at least partially remove the high angle grain boundary from between the two adjacent channel regions.

An organic light emitting diode display device including the thin film transistor and a method of fabricating the same are also provided.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Korean Patent Application No. 10-2009-0109837, filed on Nov. 13, 2009, in the Korean Intellectual Property Office, and entitled: "Thin Film Transistor, Organic Light Emitting Diode Display Device Having the Same, and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As described herein, embodiments relate to a thin film transistor including a semiconductor layer fabricated by forming a protection layer pattern on an amorphous silicon layer and performing crystallization thereon using a metal catalyst. The fabrication method may be controlled so that a high angle grain boundary is not generated in a channel region of the semiconductor layer, which may be used to improve characteristics of the thin film transistor. Embodiments also relate to an organic light emitting diode display device having the transistor and associated methods.

Embodiment 1

FIGS. 1A to 1F illustrate a TFT in accordance with an example embodiment. As described in detail below, a semiconductor layer 120 (see FIG. 1E) may be formed to provide channel and source/drain regions for a TFT. The semiconductor layer 120 may be formed by crystallization of a deposited amorphous silicon layer using a MILC-like process to form very large grained polysilicon under a protection pattern (feature 130 in FIG. 1D). The protection pattern 130 may be defined with a size, location, and orientation that is predetermined so as to produce low angle grain boundaries under the protection pattern, where the channel region of the TFT may encompass only the low angle grain boundaries, which may be oriented in the direction of current flow in the channel region (current flowing longitudinally, between the source and drain regions), while high angle grain boundaries may be formed outside of the channel region.

Figure 1A:
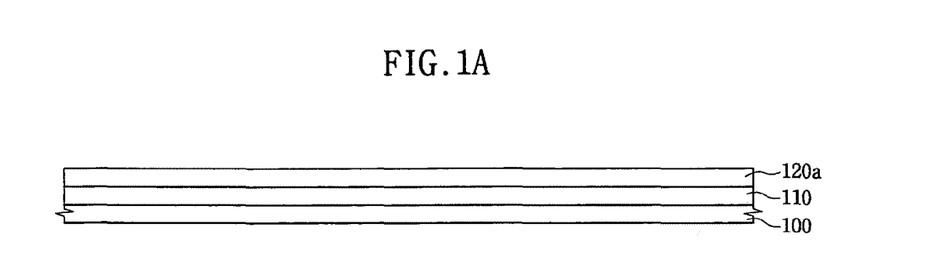
FIGS. 1A to 1G illustrate a TFT in accordance with a first example embodiment.

Referring now to FIG. 1A, a substrate 100 may be provided, and a buffer layer 110 may be formed on the substrate 100. The buffer layer 110 may be, e.g., a silicon oxide layer, a silicon nitride layer, a combination thereof, etc. In an implementation, the buffer layer 110 may cover the entire substrate 100.

Next, an amorphous silicon layer 120a may be formed on buffer layer 110. In an implementation, the amorphous silicon layer 120a may be formed on the entire surface of the buffer layer 110.

Figure 1B:
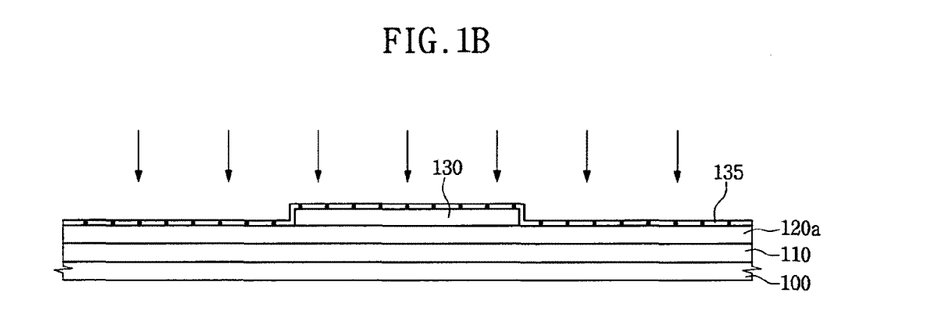

Then, referring to FIG. 1B, the protection layer pattern 130 may be formed on the amorphous silicon layer 120a. As shown in the plan views in FIGS. 1D and 1F, the protection layer pattern 130 may have a size, shape, and/or orientation that is predetermined in accordance with a channel region 120c to be defined in the semiconductor layer 120. The protection layer pattern 130 may be formed so that high angle grain boundaries do not occur in the channel region 120c, as described in further detail below. In an implementation, the protection layer pattern 130 may have a rectangular shape when viewed in plan view.

Next, a metal catalyst layer 135 may be formed on the substrate 100. In an implementation, the metal catalyst layer 135 may be formed on the entire surface of the substrate 100, including on the protection layer pattern 130. The metal catalyst layer 135 may be formed by, e.g., sputtering a metal, and may be formed directly on the underlying amorphous silicon layer 120a.

In order to prevent diffusion of the metal catalyst from the metal catalyst layer 135 into the channel region 120c, the underlying protection layer pattern 130 may have a thickness of, e.g., about 2000 Å or more, and may be formed of a silicon oxide layer, a silicon nitride layer, or a combination thereof.

The metal in the metal catalyst layer 135 may be, e.g., Ni, Pd, Ag, Au, Al, Sn, Sb, Cu, Te, Cd, a combination thereof, etc. In an example implementation, the metal is nickel (Ni). The metal catalyst layer may be formed at a relatively low concentration of the metal, e.g., $10^{12}$ to $10^{14}$ atom/cm$^2$ of the metal. As described below, the metal may react with silicon to form a silicide s (see FIG. 1C), and the silicide s may serve as a seed, i.e., a nucleus of crystallization, for lateral crystallization. Providing a concentration of metal that is about $10^{12}$ atom/cm$^2$ or higher may help ensure that the amount of the seed is sufficient to crystallize the amorphous silicon layer into a polysilicon layer. Providing a concentration of metal that is about $10^{14}$ atom/cm$^2$ or lower may help avoid the diffusion of undue amounts of metal into the amorphous silicon layer, which could cause a grain size of the resultant polysilicon layer to be reduced, and could result in amounts of metal in the semiconductor layer being so high as to deteriorate properties of the semiconductor layer.

Next, the substrate 100 may be annealed. One or more annealing operations may be employed to form silicides s from the catalyst metal layer 135, which may involve allowing diffusion of the metal from the metal catalyst layer 135 into the amorphous silicon layer 120a, and to crystallize the amorphous silicon layer 120a into the polysilicon layer 120b. The annealing may be performed at a temperature of, e.g., about 200° C. to about 700° C.

Figure 1C:
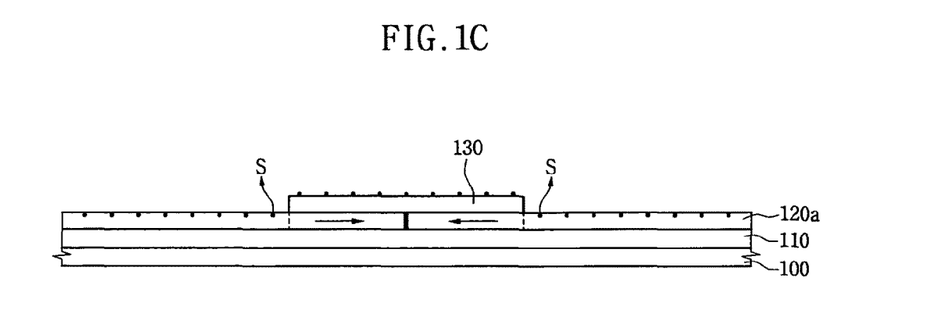
Figure 1D:
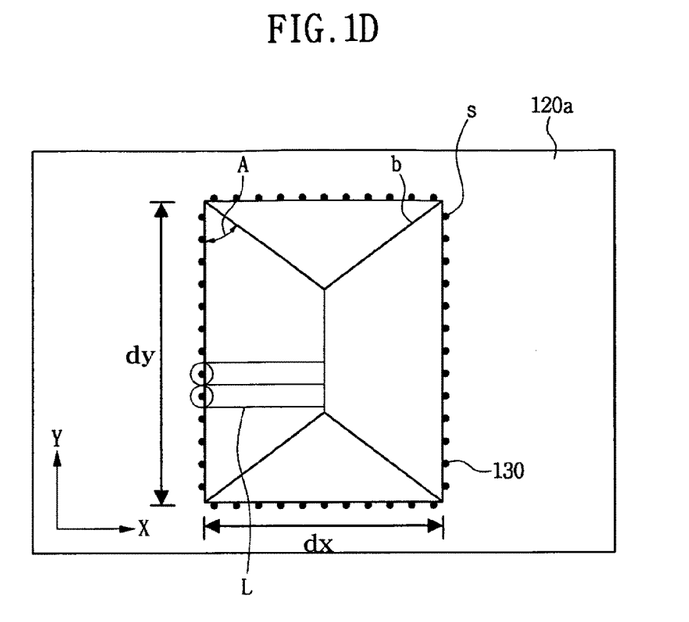

Referring to FIGS. 1C and 1D, the metal catalyst layer 135 may form the metal silicides s according to an outline of the protection layer pattern 130. Thus, lateral crystallization of the amorphous silicon layer 120a (to produce a preliminary polysilicon layer underlying the protection layer pattern 130, as shown in FIG. 1D) may commence from the peripheral edges of the protection layer pattern 130, as shown by the arrows in FIG. 1C. Controlling the amount of the metal in the metal catalyst layer 135 to be about $10^{12}$ to $10^{14}$ atom/cm$^2$ may result in a desirable spacing of the metal silicides s at intervals of about 1 to about 100 μm.

As shown in FIG. 1D, the seeds of metal silicide s arranged in a rectangular shape (the outline of the protection pattern 130) may result in the formation of a crystal structure that includes low angle grain boundaries L and high angle grain boundaries b. As crystals grows laterally from seeds of silicide s, the crystals include only the low angle grain boundaries (L in FIG. 1D) until encountering other grains extending from other seeds, at which time the meeting of the opposing crystals forms high angle grain boundaries b. Thus, referring to FIG. 1D, crystal growth inward from the left and right sides of the protection layer pattern 130 may meet to form a high angle grain boundary b that is perpendicular to the direction of growth, i.e., perpendicular to the X-axis direction. Further, crystal growth inward from the top and bottom sides of the protection layer pattern 130 in FIG. 1D may, where it encounters the crystal growth from the left and right sides, form high angle grain boundaries b that are oriented roughly 45° from the X-axis direction. Thus, since the development of the high angle grain boundary b results from crystal growth extending from four sides of the rectangular pattern of metal silicide s, the crystal grains meet to form high angle grain boundaries b of about 45° (angle A in FIG. 1D). The formation of such features is described further in U.S. Pat. No. 7,247,880 and U.S. Pat. No. 7,484,552, each of which is incorporated by reference herein in its entirety and for all purposes.

In sum, when the protection layer pattern 130 is used in the above method, since the position of the metal silicide s can be controlled so that a high quality polysilicon layer can be formed in a desired region (i.e., the location of high angle grain boundaries b can be controlled to be outside of the channel region 120c), it may be possible to improve the quality of the semiconductor layer 120.

Figure 1E:
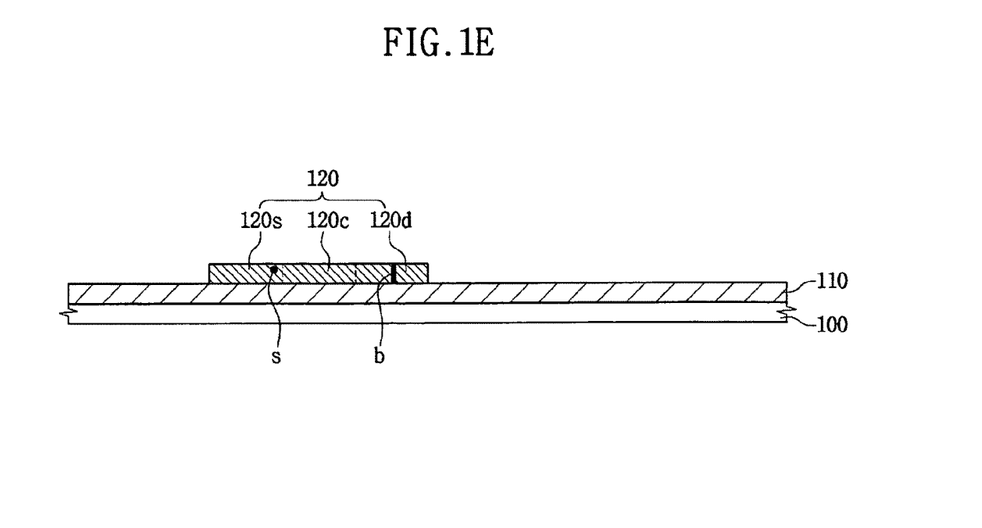
Figure 1F:
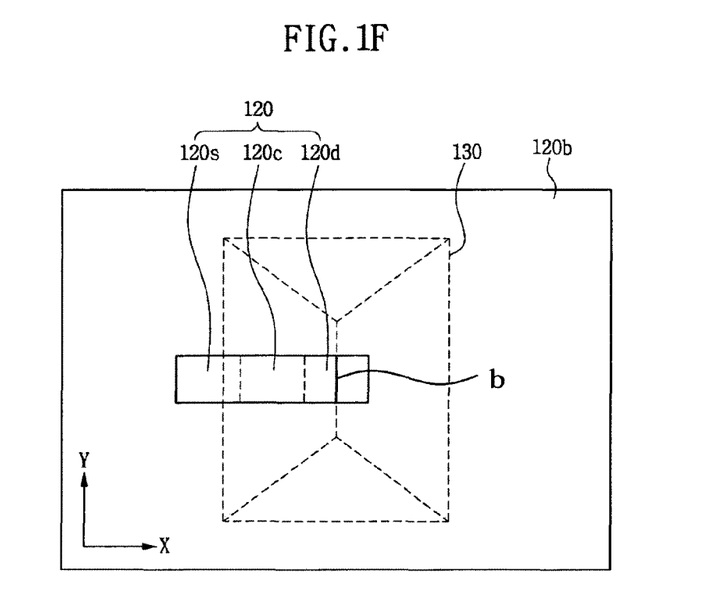
Figure 1G:
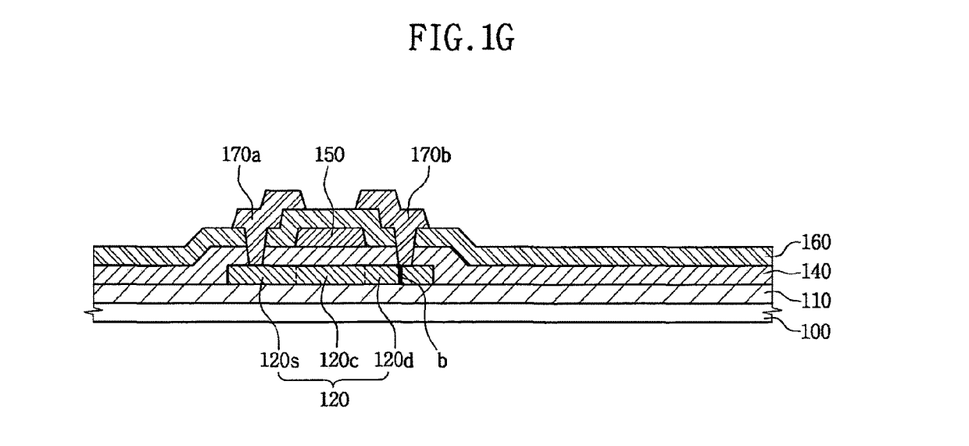

Next, referring to FIGS. 1E and 1F, the protection layer pattern 130 may be removed, and the polysilicon layer 120b may be patterned to form the semiconductor layer 120. Further, by controlling patterning of the polysilicon layer 120b, the channel region 120c can be defined in a region of the polysilicon layer 120b that does not include a high angle grain boundary b.

In further detail, it is preferable to pattern the polysilicon layer 120b according to the size, shape, and orientation of the channel region 120c to be formed. The semiconductor layer 120 includes source/drain regions 120s and 120d and the channel region 120c. Since the channel region 120c of the semiconductor layer 120 plays a very important role in properties of the TFT, a high angle grain boundary b, which may interfere with flow of electrons, should be avoided in the channel region 120c. For example, the channel region 120c may be formed from only that portion of the semiconductor layer 120 that resulted from crystals that are grown from the metal silicide s along left and right sides of the protection layer pattern 130 in FIG. 1D, such that only the low angle grain boundary L (i.e., not the high angle grain boundary b) is included in the channel region 120c. Further, as shown in FIG. 1D, it is preferable that the orientation of the crystal growth be controlled, e.g., via the layout of the protection pattern 130, such that the low angle grain boundaries L are disposed in the same direction as the current flow through the channel region 120c.

In a preferred example, the protection layer pattern 130 is formed to have a dimension $d_y$ in the Y-axis direction that is three times larger, or more, than that of the corresponding section of the channel region 120c. Further, in the preferred example, the protection layer pattern 130 is formed to have a dimension $d_x$ in the X-axis direction that is two times larger, or more, than that of the corresponding section of the channel region 120c. This may help prevent the formation of a high angle grain boundary b in the area allocated to the channel region 120c. Also, it is preferable that the protection layer pattern 130 be formed such that the metal silicides s are arranged in a linear shape along edges of the protection layer pattern 130. Preferably, the metal silicides s are not formed in a region allocated to the channel region 120c, so as to form a TFT having improved characteristics without any traps in the channel region 120c (see FIG. 1E, in which silicide s is in the source region 120s, high angle grain boundary b is in the drain region 120d, neither silicide s nor high angle grain boundary b is in the channel region 120c, and low angle grain boundaries L (see FIG. 1D) extend through the channel region 120c in a direction that is the same as current flow through the channel region 120c).

Referring again to the embodiment described in FIGS. 1A-1G, FIG. 1G shows a gate insulating layer 140 is formed on a semiconductor layer 120, and a gate electrode 150 formed on the gate insulating layer 140 to correspond to the channel region 120c of the semiconductor layer 120. An interlayer insulating layer 160 may be formed, and source/drain electrodes 170a and 170b may be formed to be electrically connected to the source/drain regions 120s and 120d of the semiconductor layer 120. Thus, a TFT may be formed.

Figure 1H:
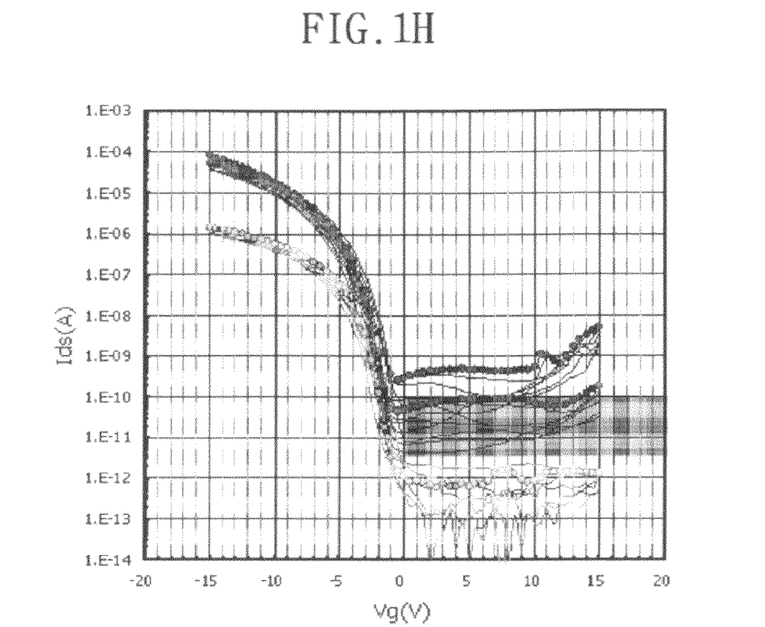
FIG. 1H illustrates property data of a semiconductor layer including a grain boundary.
Figure 1I:
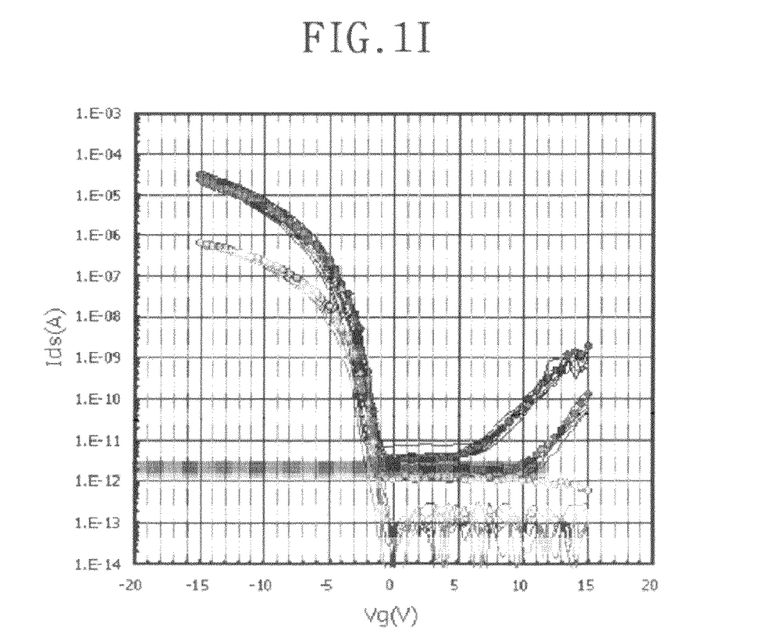
FIG. 1I illustrates property data of a semiconductor layer having no grain boundary.

FIG. 1H shows property data of leakage current distribution of a TFT in which a high angle grain boundary is provided in a channel region of a semiconductor layer, and FIG. 1I shows property data of leakage current distribution of a TFT in which no high angle grain boundary is provided in a channel region of a semiconductor layer. It can be seen that the leakage current is abruptly reduced upon Ioff in FIG. 1I having no high angle grain boundary. Thus, the semiconductor layer channel region having no high angle grain boundary in accordance with an example embodiment may provide the TFT with improved properties.

Embodiment 2

Embodiment 2 relates to an OLED display device including the TFT described in Embodiment 1 above, and, thus, the description of some elements may be omitted to avoid repetition.

Figure 2:
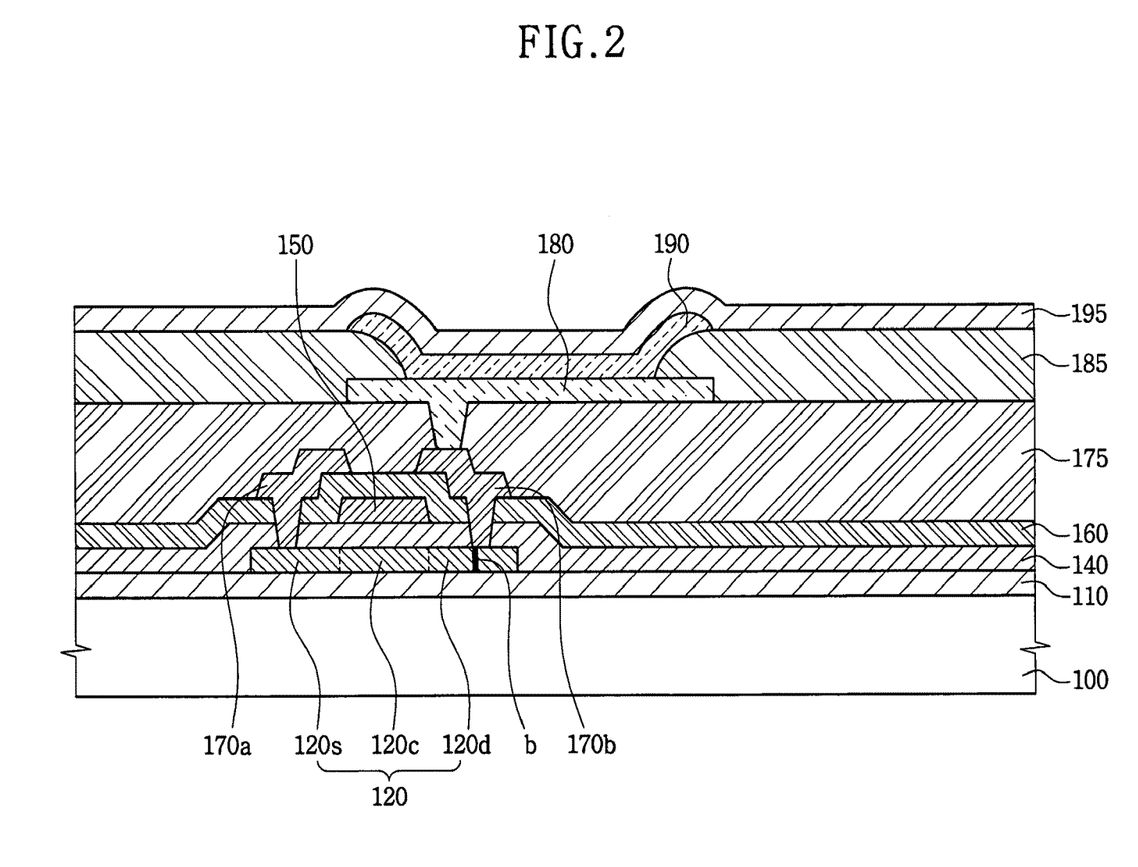
FIG. 2 illustrates a view of an OLED display device in accordance with a second example embodiment.

FIG. 2 illustrates a view of an OLED display device in accordance with the second example embodiment. Referring to FIG. 2, a protection layer 175 may be formed on the substrate 100 including the TFT to expose portions of the source/drain electrodes 170a and 170b.

Next, a first electrode 180, electrically connected to the source/drain electrodes 170a and 170b, may be formed on the protection layer 175. Then, a portion of the first electrode 180 may be exposed to form a pixel defining layer 185, the pixel defining layer 185 defining a pixel.

Next, an organic layer 190 including an organic emission layer may be formed on the exposed first electrode 180, and a second electrode 195 may be formed thereon. In an implementation, the second electrode 195 may be formed on the entire surface of the substrate 100. One or more such TFTs may be electrically coupled to an OLED in a pixel circuit in each pixel. The TFT may serve as a drive transistor, etc., for the OLED, the TFTs and OLEDs being replicated throughout a plurality of pixels in an OLED display device.

As can be seen from the foregoing, in crystallizing an amorphous silicon layer using a metal catalyst and a protection layer pattern, it is possible to control the relationship of a channel region to crystal grain boundaries, which may be useful to provide a TFT and an OLED display device having improved characteristics. Further, such a method may avoid the need for laser annealing, which may require expensive laser equipment. Further, such a method may avoid metal contamination that occurs in general methods such as metal induced crystallization (MIC) and metal induced lateral crystallization (MILC).

Meanwhile, other techniques of adjusting a metal ion concentration through an ion implantation device and forming a high quality polysilicon layer through high temperature treatment, rapid annealing or laser irradiation, in order to reduce the amount of the metal, and a crystallization method of mixing a viscous organic layer with a liquid metal, depositing a thin film through a spin coating method, and crystallizing them through annealing, in order to flatten the surface of the polysilicon layer through the MILC method, have been discussed. However, such crystallization methods may have problems in large size and uniformity of grains, which are important in a polysilicon layer.

Further, a super grain silicon (SGS) crystallization method of depositing a metal catalyst layer on a substrate after forming an amorphous silicon layer, diffusing a metal catalyst to the amorphous silicon layer through a capping layer using annealing or a laser to form a seed, and obtaining a polysilicon layer using the seed, has been discussed. In the SGS crystallization method, since the metal catalyst is diffused through the capping layer, it may be possible to prevent excessive metal contamination. However, it may be difficult to uniformly control the metal catalyst at a low concentration and control a crystallization starting point, growth direction, and grain size.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film transistor, comprising:
   a substrate;
   a buffer layer on the substrate;
   a semiconductor layer including source/drain regions and a channel region on the buffer layer, the channel region including a polysilicon layer;
   a gate insulating layer corresponding to the channel region;
   a gate electrode corresponding to the channel region; and
   source/drain electrodes electrically connected to the semiconductor layer,
   a metal silicide disposed in a region of the semiconductor layer except the channel region, wherein:
   the polysilicon layer of the channel region includes only a low angle grain boundary, and a high angle grain boundary is disposed in a region of the semiconductor layer except the channel region, and
   the channel region is between the metal silicide and the high angle grain boundary.

2. The thin film transistor as claimed in claim 1, wherein the metal silicide is spaced apart from the high angle grain boundary and is arranged at an opposing side of the semiconductor layer than the high angle grain boundary.

3. The thin film transistor as claimed in claim 1, wherein the low angle grain boundary extends in a same direction as current flow through the channel region, and the high angle grain boundary extends in a direction perpendicular to current flow through the channel region.

4. The thin film transistor as claimed in claim 1, wherein the low angle grain boundary is a boundary between crystal grains that extend from crystal seeds of a metal silicide, the metal silicide being disposed at intervals of about 1 μm to about 100 μm.

5. The thin film transistor as claimed in claim 1, wherein the source/drain wherein the source/drain regions include a first source/drain region on one end of the semiconductor layer and a second source/drain region on an opposing end of the semiconductor layer, the channel region being between the first source/drain region and the second source/drain region, and the metal silicide being arranged only in the first source/drain region and the high angle grain boundary being arranged only in the second source/drain region.

6. A method of fabricating a thin film transistor, the method comprising:

forming a buffer layer on a substrate;

forming a semiconductor layer including source/drain regions and a channel region on the buffer layer, the channel region including a polysilicon layer, and forming the semiconductor layer includes disposing a metal silicide in a region of the semiconductor layer except the channel region;

forming a gate insulating layer corresponding to the channel region;

forming a gate electrode corresponding to the channel region; and forming source/drain electrodes electrically connected to the semiconductor layer, wherein:

the polysilicon layer of the channel region is formed to include only a low angle grain boundary, and a high angle grain boundary is formed in a region of the semiconductor layer except the channel region, and the channel region is between the metal silicide and the high angle grain boundary.

7. The method as claimed in claim 6, wherein forming the semiconductor layer includes:

forming an amorphous silicon layer on the buffer layer;

forming a protection layer pattern on a portion of the amorphous silicon layer;

forming a metal catalyst layer on the substrate;

annealing the substrate, on which the metal catalyst layer is formed, to form a linear pattern including the metal silicide at edges of the protection layer pattern and then crystallizing the amorphous silicon layer to form a preliminary polysilicon layer using the metal silicide as a seed, where the metal silicide is formed from metal in the metal catalyst layer;

removing at least part of the protection layer pattern; and patterning the preliminary polysilicon layer to form the semiconductor layer.

8. The method as claimed in claim 7, wherein the protection layer pattern is formed to have a rectangular shape and a thickness of 2000 Å or more.

9. The method as claimed in claim 7, wherein the channel region of the semiconductor layer is between the linear pattern of the metal silicide and the high angle grain boundary.

10. The method as claimed in claim 7, wherein forming the metal catalyst layer includes disposing about $10^{12}$ to about $10^{14}$ atom/cm$^2$ of a catalyst metal on the substrate.

11. The method as claimed in claim 10, wherein the catalyst metal is nickel and the metal silicide is nickel silicide.

12. The method as claimed in claim 7, wherein the protection layer pattern has a dimension in a direction orthogonal to the channel region that is about three times the length of the channel region, and the protection layer pattern has a dimension in a direction parallel to the channel region that is about two times the width of the channel region.

13. An organic light emitting diode display device, comprising:

a substrate;

a buffer layer disposed on the substrate;

a semiconductor layer including source/drain regions and a channel region on the buffer layer, the channel region including a polysilicon layer;

a gate insulating layer corresponding to the channel region;

a gate electrode corresponding to the channel region; and an interlayer insulating layer on the substrate;

source/drain electrodes electrically connected to source/drain regions of the semiconductor layer;

a metal silicide disposed in a region of the semiconductor layer except the channel region;

a protection layer on the substrate; and an organic light emitting diode including a first electrode electrically connected to one of the source/drain electrodes, an organic layer, and a second electrode, wherein:

the polysilicon layer of the channel region includes only a low angle grain boundary, and a high angle grain boundary is disposed in a region of the semiconductor layer except the channel region, and the channel region is between the metal silicide and the high angle grain boundary.

14. The organic light emitting diode display device as claimed in claim 13, wherein the metal silicide is spaced apart from the high angle grain boundary and is arranged at an opposing side of the semiconductor layer than the high angle grain boundary.

15. The organic light emitting diode display device as claimed in claim 13, wherein the low angle grain boundary extends in a same direction as current flow through the channel region, and the high angle grain boundary extends in a direction perpendicular to current flow through the channel region.

16. The organic light emitting diode display device as claimed in claim 13, wherein the low angle grain boundary is a boundary between crystal grains that extend from crystal seeds of a metal silicide, the metal silicide being disposed at intervals of about 1 μm to about 100 μm.

17. The organic light emitting diode display device as claimed in claim 13, wherein the source/drain regions include a first source/drain region on one end of the semiconductor layer and a second source/drain region on an opposing end of the semiconductor layer, the channel region being between the first source/drain region and the second source/drain region, and the metal silicide being arranged only in the first source/drain region and the high angle grain boundary being arranged only in the second source/drain region.

* * * * *